(12) United States Patent
Nair et al.

(10) Patent No.: US 6,849,909 B1
(45) Date of Patent: Feb. 1, 2005

(54) METHOD AND APPARATUS FOR WEAK INVERSION MODE MOS DECOUPLING CAPACITOR

(75) Inventors: Rajendran Nair, Hillsboro, OR (US); Siva G. Narendra, Beaverton, OR (US); Tanay Karnik, Portland, OR (US); Vivek K. De, Beaverton, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/677,698

(22) Filed: Sep. 28, 2000

(51) Int. Cl.[7] .................. H01L 31/119; H01L 29/90; H01L 29/088

(52) U.S. Cl. .................. 257/412; 257/754; 257/757; 257/901

(58) Field of Search ................ 257/412, 757, 257/754, 901

(56) References Cited

U.S. PATENT DOCUMENTS

| | | | | |
|---|---|---|---|---|
| 3,619,735 A | * | 11/1971 | Chen | 317/324 |
| 3,769,105 A | * | 10/1973 | Chen et al. | 148/175 |
| 4,055,837 A | * | 10/1977 | Stein et al. | 340/173 |
| 4,250,414 A | * | 2/1981 | Kirsch | 307/296 |
| 4,437,139 A | * | 3/1984 | Howard | 361/313 |
| 4,529,889 A | * | 7/1985 | Dumbri | 307/269 |
| 4,936,928 A | * | 6/1990 | Shaw et al. | 148/33.4 |
| 5,376,839 A | * | 12/1994 | Horiguchi et al. | 327/541 |
| 5,506,748 A | * | 4/1996 | Hoshiba | 361/321.4 |
| 5,614,018 A | * | 3/1997 | Azuma et al. | 117/68 |
| 5,851,891 A | * | 12/1998 | Dawson et al. | 438/305 |
| 6,133,050 A | * | 10/2000 | Azuma et al. | 438/3 |
| 6,219,270 B1 | * | 4/2001 | Van Geloven et al. | 365/119 |

FOREIGN PATENT DOCUMENTS

| | | | |
|---|---|---|---|
| DE | 210278 C | * | 6/1982 |
| JP | 2000040949 A | * | 2/2000 |

* cited by examiner

*Primary Examiner*—Long Pham
*Assistant Examiner*—Shrinivas H Rao
(74) *Attorney, Agent, or Firm*—Dennis A. Nicholls

(57) ABSTRACT

A method and apparatus for providing a weak inversion mode metal-oxide-semiconductor (MOS) decoupling capacitor is described. In one embodiment, an enhancement-mode p-channel MOS (PMOS) transistor is constructed with a gate material whose work function differs from that commonly used. In one exemplary embodiment, platinum silicate (PtSi) is used. In alternate embodiments, the threshold voltage of the PMOS transistor may be changed by modifying the dopant levels of the substrate. In either embodiment the flat band magnitude of the transistor is shifted by the change in materials used to construct the transistor. When such a transistor is connected with the gate lead connected to the positive supply voltage and the other leads connected to the negative (ground) supply voltage, an improved decoupling capacitor results.

10 Claims, 7 Drawing Sheets

METHOD AND APPARATUS FOR WEAK INVERSION MODE MOS DECOUPLING CAPACITOR

FIELD OF THE INVENTION

The present invention relates to a decoupling capacitor for an integrated circuit, and, more specifically, to a weak inversion capacitor for an integrated circuit.

BACKGROUND

Rapidly changing supply currents in digital circuits may induce noise onto the power supply lines and cause other problems. One technique to avoid this induced noise is to place capacitors, connected between the power supply traces and ground, physically near to those elements within the digital circuits that mar, require rapidly changing supply currents. Capacitors used in this manner are called decoupling capacitors or bypass capacitors. These are used in circuit designs as a means of supplying a low-impedance source of current when rapidly changing supply current is demanded by other elements of the circuit. Another viewpoint of decoupling capacitors is that they filter noise on the power supply lines.

Designers have various options when using decoupling capacitors on printed wiring boards. A mixture of high-capacitance electrolytic capacitors to suppress low-frequency changes and small-capacitance mica or ceramic capacitors to suppress high-frequency changes is commonly used. However, when placing decoupling capacitors on an integrated circuit, the capacitors, as with other circuit elements such as the resistors, must be fabricated from silicon, doped silicon, and deposited metal.

One common method uses the gate capacitance inherent in a metal-oxide-semiconductor (MOS) transistor as the decoupling capacitor. For example, a standard enhancement-mode p-type MOS (PMOS) device, well-known in the art, may be used. In one configuration, the gate electrode is connected to the negative Vss connections and the drain, source, and substrate electrodes are connected to the positive Vcc connections. This configuration, called a "strong inversion" mode, was successfully used in integrated circuits until quite recently. Then, as gate oxide layers became thinner, the leakage current through the gate oxide became substantial. In another configuration, the drain, source, and substrate electrodes are connected to the negative Vss connections and the gate electrode is connected to the positive Vcc connections. This configuration, called a "depletion" mode, avoids the leakage through the gate oxide but has poor capacitance to voltage characteristics.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

A method and apparatus for providing a weak inversion mode metal-oxide-semiconductor (MOS) decoupling capacitor is described. In one embodiment, an enhancement-mode p-channel MOS (PMOS) transistor is constructed with a gate material whose work function differs from that commonly used. In one exemplary embodiment, platinum silicate (PtSi) is used. In alternate embodiments, the threshold voltage of the PMOS transistor may be changed by modifying the dopant levels of the substrate. In either embodiment the flat band magnitude of the transistor is shifted by the change in materials used to construct the transistor. When such a transistor is connected with the gate lead connected to the positive supply voltage and the other leads connected to the negative (ground) supply voltage, an improved decoupling capacitor results.

Figure 1:
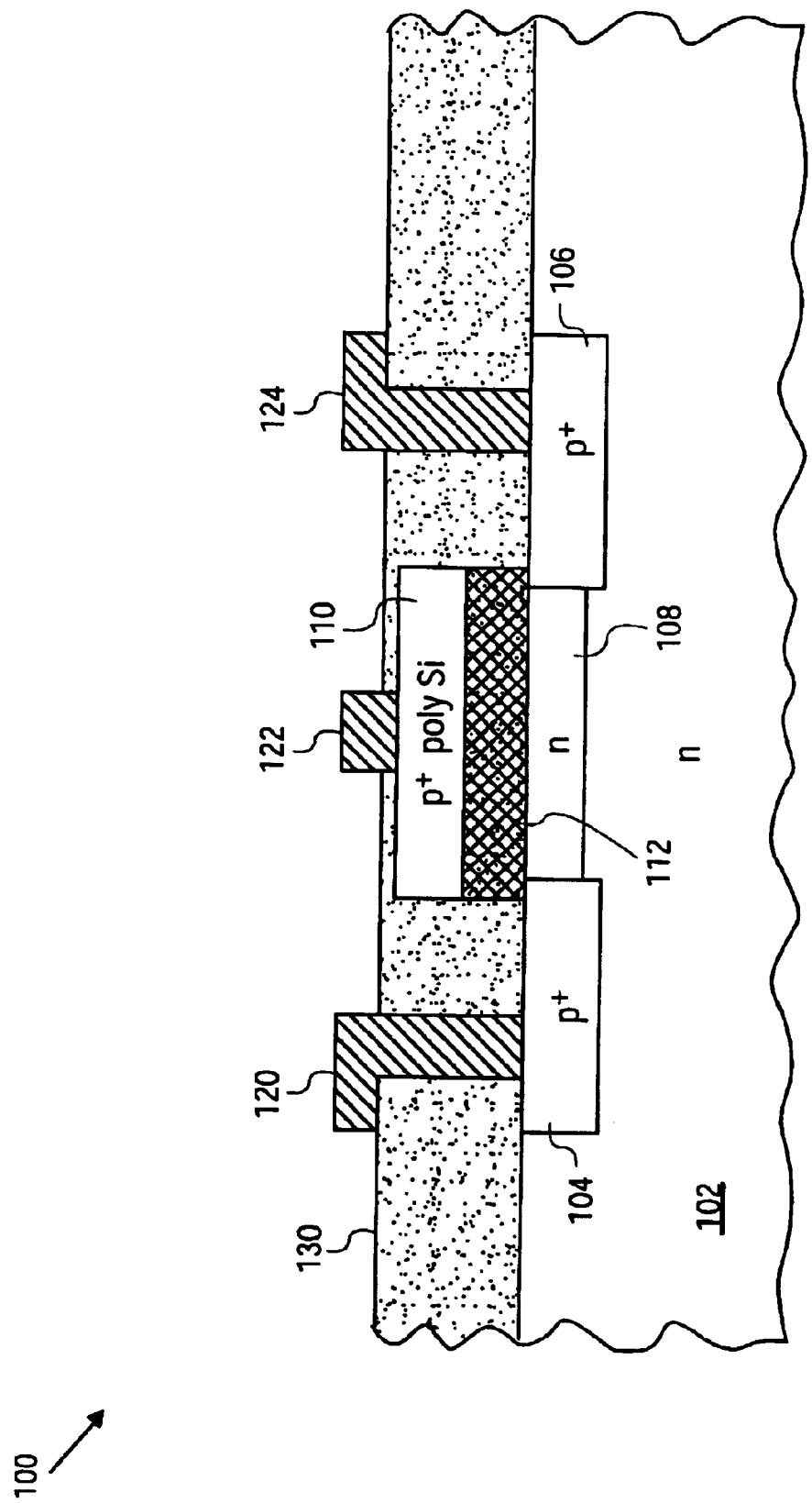
FIG. 1 is a cross-sectional view of a poly-silicon-gate p-channel metal-oxide-semiconductor (PMOS) transistor.

Referring now to FIG. 1, a cross-sectional view of a poly-silicon-gate p-channel metal-oxide-semiconductor (PMOS) transistor 100 is shown. An n-type substrate 102 forms the basis of the transistor 100. A source area 104 and a drain area 106 are fabricated by diffusion to form highly-doped p-type (p+) material. A channel area 108 retains the n-type material of the substrate 102. A gate insulator area 112 is formed over the channel area 108. A gate region 110 is deposited over gate insulator area 112. In one common embodiment, gate region 110 is formed from highly-doped p-type (p+) polycrystalline silicon (poly-Si). The transistor 100 is finished with silicon oxide insulator layer 130 being deposited, and then etched, prior to the depositing of the source electrode 120, the gate electrode 122, and the drain electrode 124.

Figure 2:
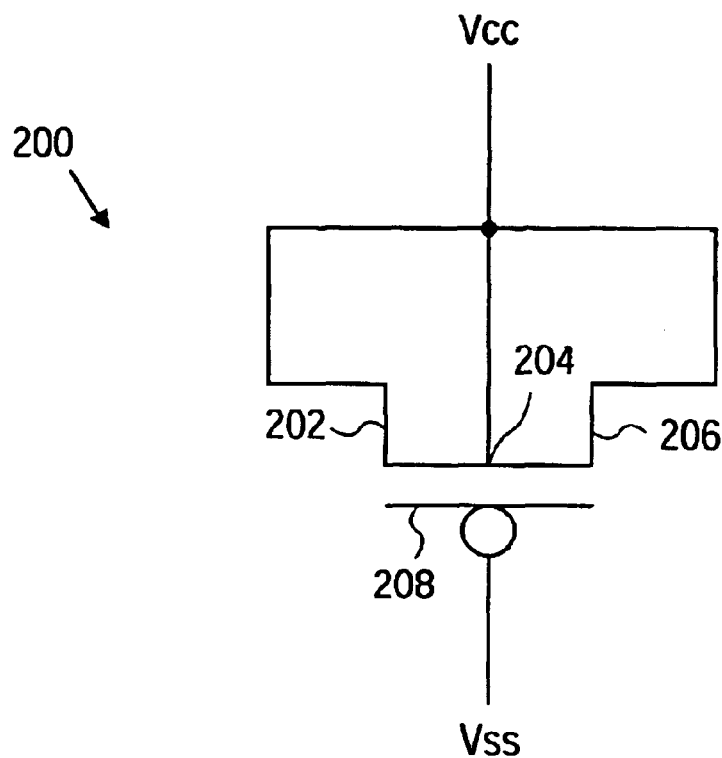
FIG. 2 is a schematic diagram of the PMOS transistor of FIG. 1 configured as a strong inversion capacitor.

Referring now to FIG. 2, a schematic diagram of the PMOS transistor 100 of FIG. 1 configured as a strong inversion capacitor 200 is shown. In the FIG. 2 embodiment, the gate electrode 208 is connected to the negative power supply line (Vss or ground). The drain electrode 202, the substrate electrode 204, and the source electrode 206 are connected together and to the positive power supply line (Vcc).

The FIG. 2 configuration gives good capacitance values for use as a decoupling capacitor. However, as gate insulator area 112 becomes thinner in newer device processes, there may be a significant probability of direct band-to-band tunneling between the gate region 110 and the channel area 108. This would result in significant leakage current. When many of these decoupling capacitors are used on an integrated circuit, the leakage current through them may become significant.

Figure 3:
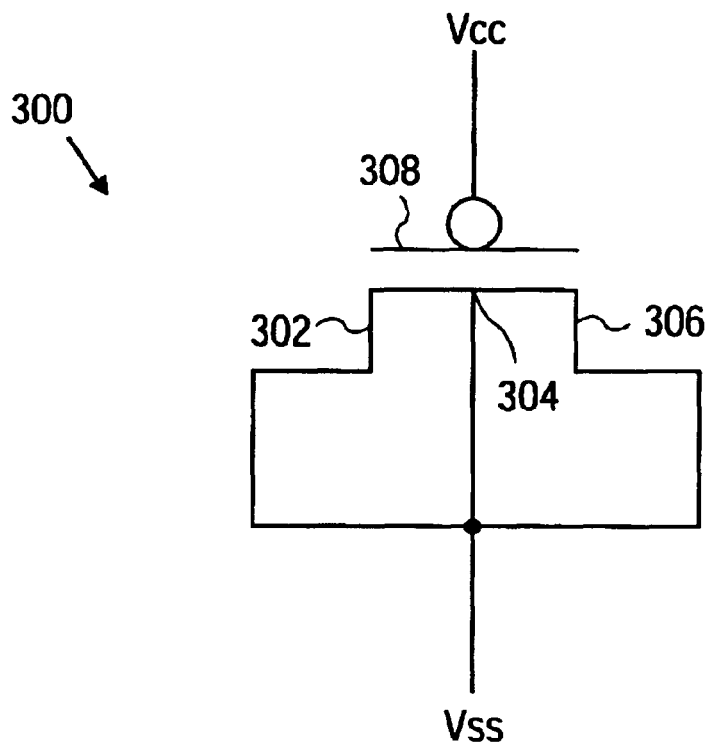
FIG. 3 is a schematic diagram of the PMOS transistor of FIG. 1 configured as a depletion mode capacitor.

Referring now to FIG. 3, a schematic diagram of the PMOS transistor 100 of FIG. 1 configured as a depletion mode capacitor 300 is shown. In the FIG. 3 embodiment, the gate electrode 308 is connected to the positive power supply line (Vcc). The drain electrode 302, the substrate electrode 304, and the source electrode 306 are connected together and to the negative power supply line (Vss or ground).

The FIG. 3 configuration was proposed to mitigate the leakage current discussed above in relation to the FIG. 2 strong inversion capacitor 200. When PMOS transistor 100 is configured as shown in FIG. 3, it is in depletion mode, and therefore there is little mobile charge in channel area 108 which could tunnel through gate insulator area 112. Testing has shown the reduction in gate leakage current of depletion mode capacitor 300 is on the order of 10 to 100 times when compared with a strong inversion capacitor 200 of similar size.

Figure 4:
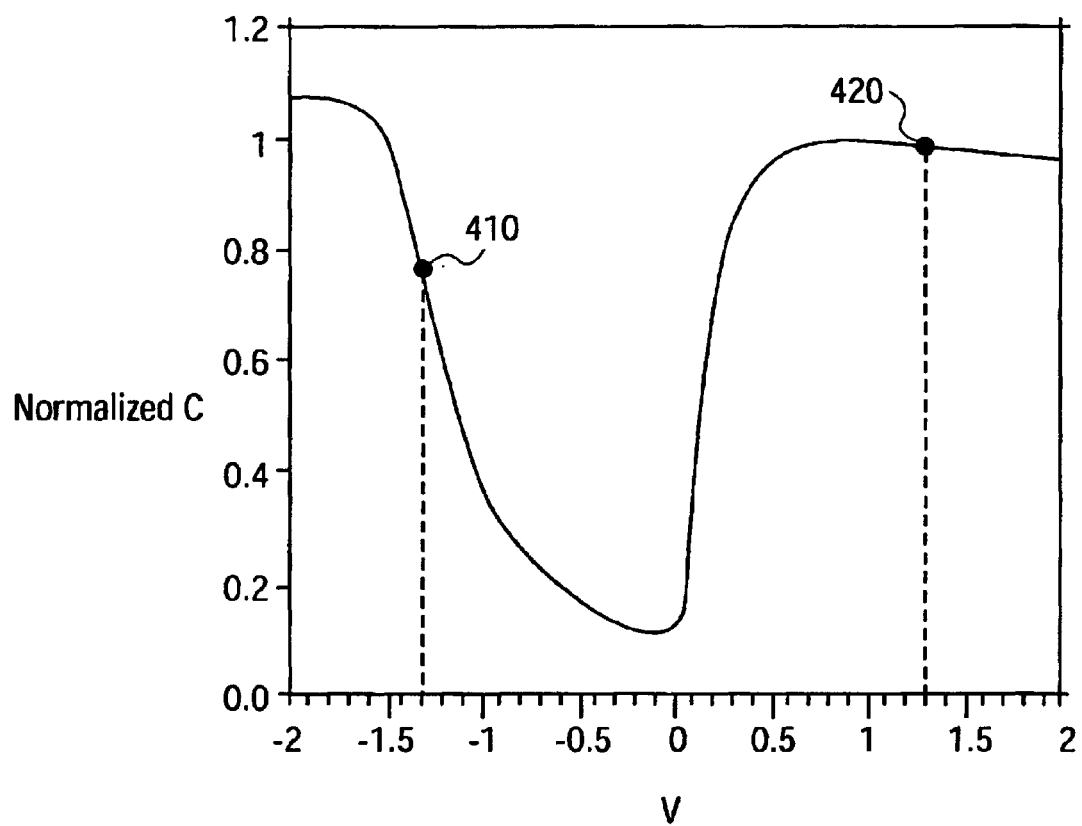
FIG. 4 is capacitance-to-voltage chart for the capacitors of FIGS. 2 and 3.

Referring now to FIG. 4, a capacitance-to-voltage chart for the capacitors of FIGS. 2 and 3 is shown. The FIG. 4 chart shows normalized capacitance (C) on the y-axis. This assigns a base unit of capacitance per unit area to the FIG. 2 decoupling capacitor. The x-axis shows voltage (V) where V is measured from the substrate to the gate ($V=V_{substrate}-V_{gate}$). Hence, V is a positive quantity for the FIG. 2 decoupling capacitor, whereas V is a negative quantity for the FIG. 3 decoupling capacitor.

Point 420 on the chart shows the performance of the FIG. 2 decoupling capacitor. The capacitance of the strong inversion capacitor 200 is seen to be close to the maximum value of C for any point on the graph. Another way of viewing this is that the rate of change C/V is very low. The capacitance of strong inversion capacitor 200 stays essentially constant over a range of V from about 0.5 volts to above 2 volts. When used with a power supply voltage of 1.3 volts, the capacitance of strong inversion capacitor 200 is essentially constant in the noise range of interest around 1.3 volts.

Point 410 on the chart shows the performance of the FIG. 3 decoupling capacitor. The capacitance of the depletion mode capacitor 300 is seen to be somewhat less (about 80%) in comparison to that of strong inversion capacitor 200, when both are used with a power supply voltage of 1.3 volts. A greater source of trouble is that when noise spikes pull down the local power supply voltage below 1.3 volts, the capacitance value goes down steeply.

Both of these potential problems with the depletion mode capacitor 300 may be partially mitigated by making the physical size of depletion mode capacitor 300 about twice the size of a comparable strong inversion capacitor 200. Since the depletion mode capacitor 300 has reduction in gate leakage current on the order of 10 to 100 times when compared to a similarly-sized strong inversion capacitor 200, a depletion mode capacitor 300 with twice the area of a strong inversion capacitor 200 will still have a reduction in gate leakage current on the order of 5 to 50 times. However, doubling the size of the decoupling capacitors may be a less than optimal solution.

Figure 5:
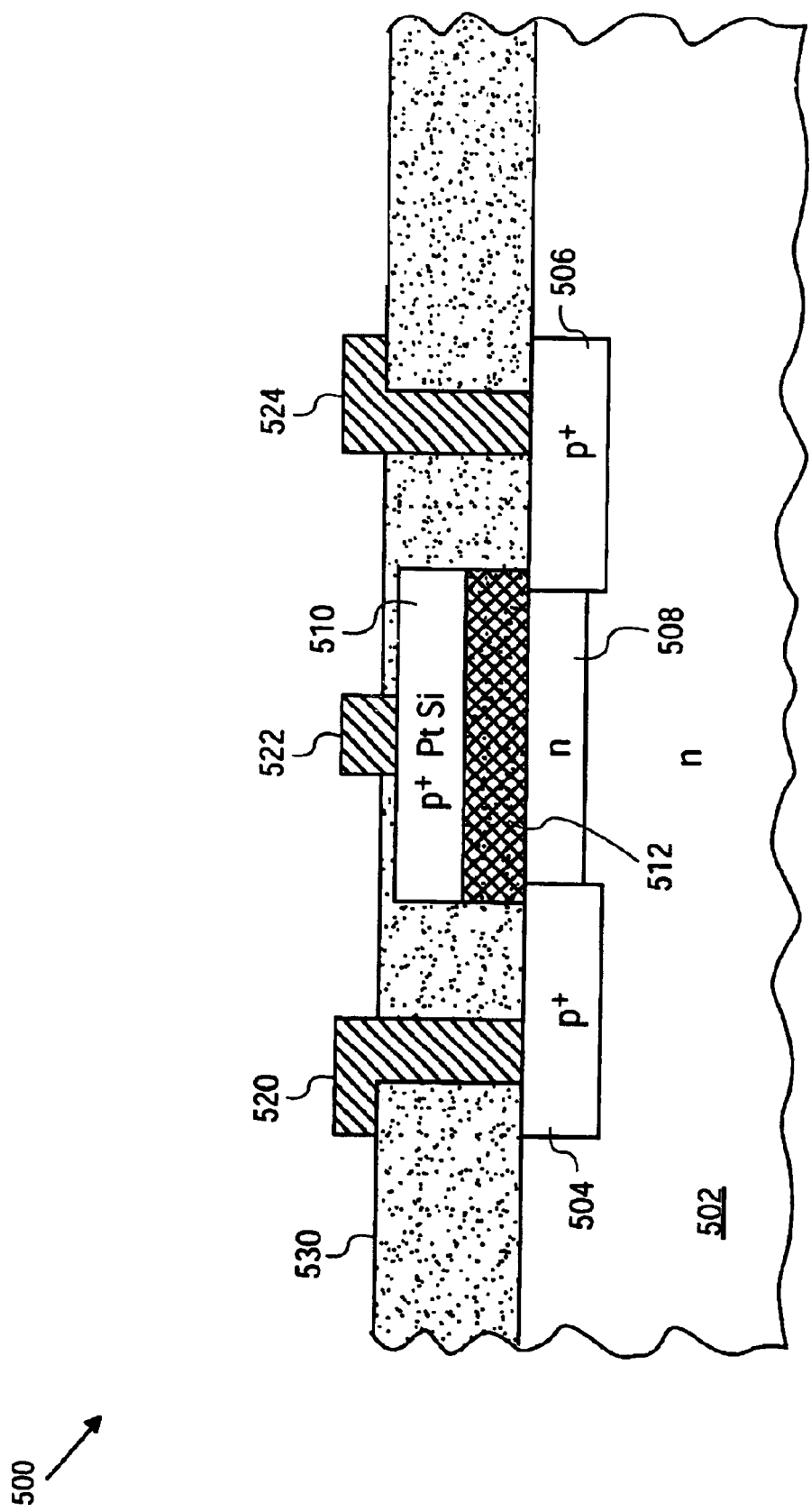
FIG. 5 is a cross-sectional view of a platinum-silicide-gate PMOS transistor, according to one embodiment of the present invention.
Figure 6:
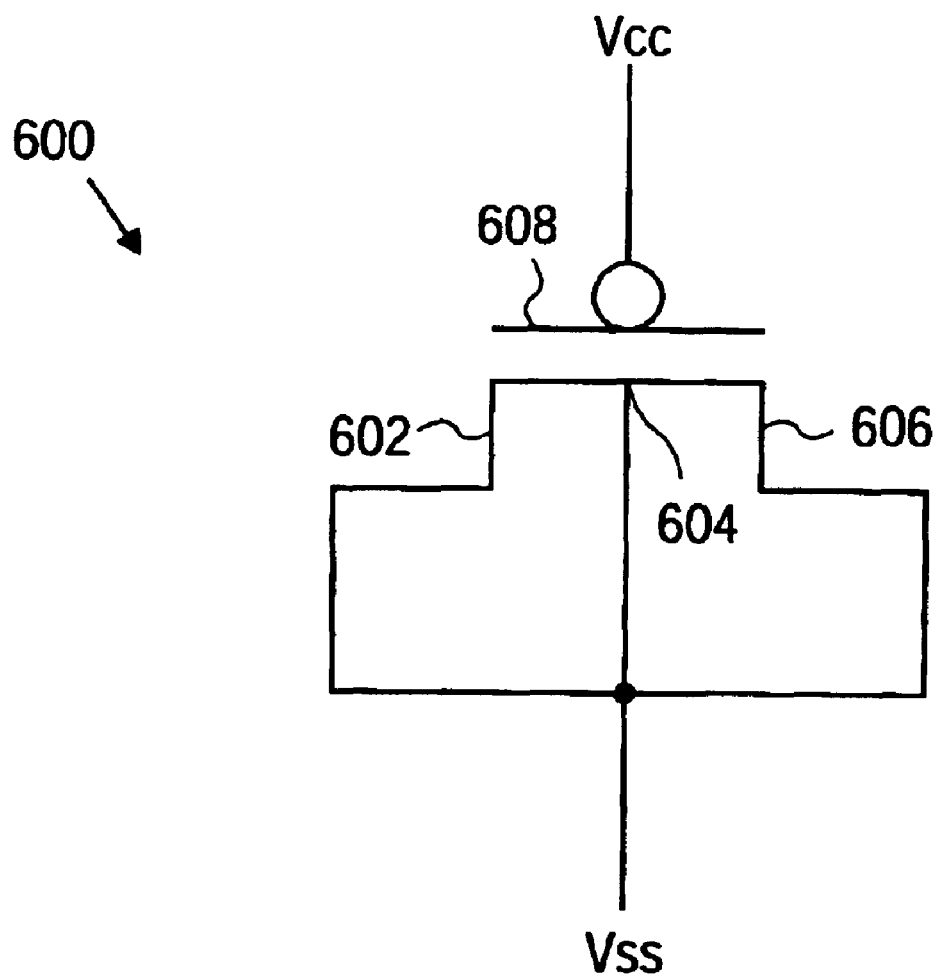
FIG. 6 is a schematic diagram of the PMOS transistor of FIG. 5 configured as a weak inversion capacitor, according to one embodiment of the present invention.

Referring now to FIG. 5, a cross-sectional view of a platinum-silicide (PtSi) gate PMOS transistor 500 is shown, according to one embodiment of the present invention. An n-type substrate 502 forms the basis of the transistor 500. A source area 504 and a drain area 506 are fabricated by diffusion to form highly-doped p-type (p+) material. A channel area 508 retains the n-type material of the substrate 502. A gate insulator area 512 is formed over the channel area 508. A gate region 510 is deposited over gate insulator area 512. Unlike the PMOS transistor 100 of FIG. 1, in one embodiment of PMOS transistor 500 the gate region 510 is formed from highly-doped p-type (p+) platinum-silicide (PtSi). In alternate embodiment, when decoupling differing supply voltages, gate region 510 may be formed from tantalum nitrate (TaN), iridium (Ir), nickel (Ni), arsenic (As), or other similar materials used either by themselves or as dopants of another material. The PMOS transistor 500 is finished with silicon oxide insulator layer 530 being deposited, and then etched, prior to the depositing of the source electrode 520, the gate electrode 522, and the drain electrode 524. Referring now to FIG. 6, a schematic diagram of the PMOS transistor 500 of FIG. 5 configured as a weak inversion capacitor 600 is shown, according to one embodiment of the present invention. In the FIG. 6 embodiment, the gate electrode 608 is connected to the positive power supply line (Vcc). The drain electrode 602, the substrate electrode 604, and the source electrode 606 are connected together and to the negative power supply line (Vss or ground). The weak inversion capacitor 600 of FIG. 6 differs principally from depletion mode capacitor 300 of FIG. 3 in that the threshold voltage Vt of PMOS transistor 500 has been shifted by shifting the flat band of PMOS transistor 500. The expression "flat band" may be defined to mean that region where the work function difference between the gate and the body material that needs to be overcome so that the potential from the gate to the body of the device is flat.

In one embodiment of the present invention, the weak inversion capacitor 600 may be used as a decoupling or bypass capacitor for a power supply line. In alternate embodiments, however, weak inversion capacitor 600 may also be used to decouple other sources of constant voltage, such as a precision voltage reference.

Figure 7:
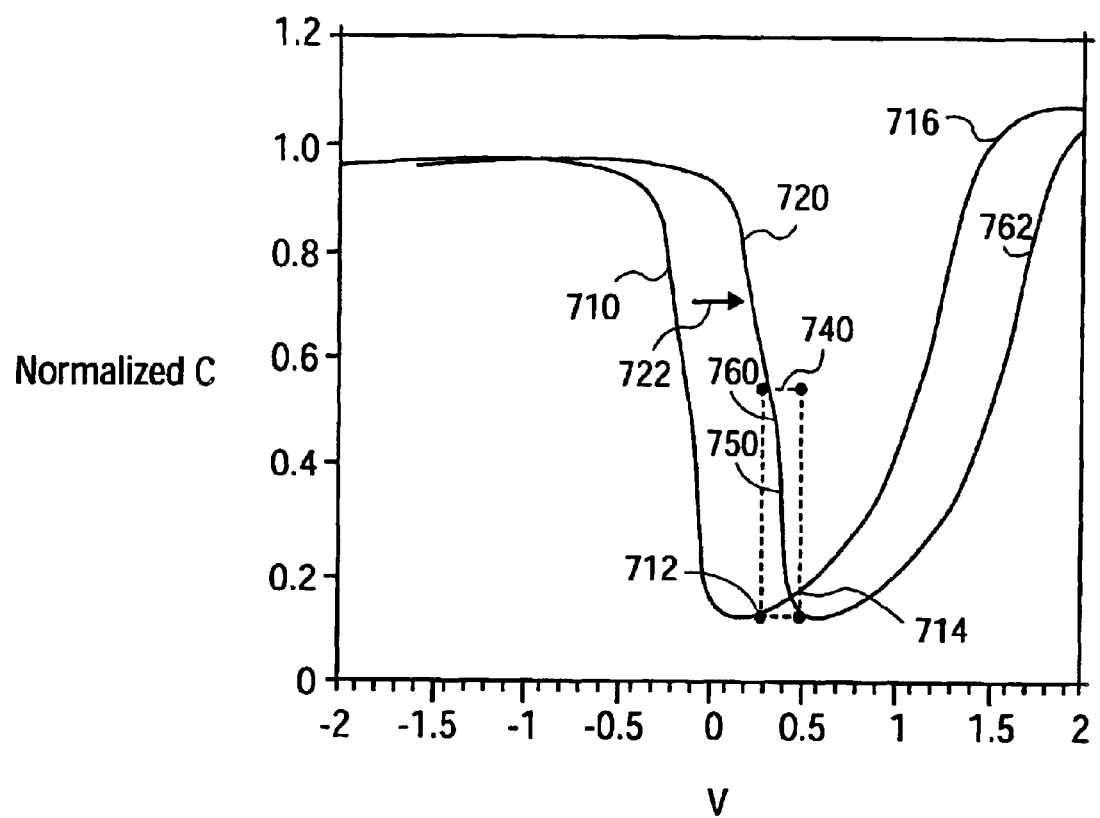
FIG. 7 is a capacitance-to-voltage chart for the capacitor of FIG. 6, according to one embodiment of the present invention.

Referring now to FIG. 7, a capacitance-to-voltage chart for the weak inversion capacitor 600 of FIG. 6 is shown, according to one embodiment of the present invention. As with the FIG. 4 chart, the FIG. 7 chart shows normalized capacitance (C) on the y-axis. However, the x-axis shows voltage (V) where the FIG. 7 V is measured from the gate to the substrate ($V=V_{gate}-V_{substrate}$). For this reason the chart of FIG. 7 appears reversed about the y-axis when compared to the chart of FIG. 4.

Curve 710 duplicates the FIG. 4 curve of depletion mode capacitor 300. For a situation where, for example, a power supply voltage Vcc of 0.4 volts is used, a decoupling capacitor such as depletion mode capacitor 300 has certain shortcomings. Curve 710 shows a low capacitance value for depletion mode capacitor 300 when at point 712, corresponding to a voltage-lowering noise spike, just when the maximum capacitance would be useful. A higher capacitance value for depletion mode capacitor 300 is obtained at point 714, when at full power supply voltage. Thus the depletion mode capacitor 300 exhibits the poor combination of low capacitance when noise exists and maximum leakage current at steady-state power conditions. It would be better to have a greater value of capacitance at 0.4 volts which would then increase, not decrease, with noise voltage.

In one embodiment of the present invention, the curve 710 is shifted to the right as shown by arrow 722 to form curve 720. This shift may occur in response to changing the flat band magnitude from about 1.5 volts (point 716 on curve 710) to about 1.98 volts (point 762 on curve 720). Here the term "flat band magnitude" may have the definition of the size of the work function difference between the gate and the body material that needs to be overcome so that the potential from the gate to the body of the device is flat.

Curve 720 may represent the capacitance-to-voltage characteristics of a weak inversion capacitor 600. At the nominal supply voltage Vcc of 0.4 volts, at point 750, the capacitance value is low, but so is the leakage current value. At a point 760 corresponding to a voltage-lowering noise spike, the value of the capacitance shown in curve 720 is increasing rapidly with the size of the noise spike. By shifting the location of the flat band by about 0.48 volts, the curve 710 is shifted by about 0.48 volts to the right to form curve 720. This places the weak inversion portion of curve 720 within the range of interest 740 of a Vcc of 0.4 volts with 0.1 volts noise amplitude. At the nominal Vcc voltage of 0.4 volts, at point 750 on curve 720, a much larger value of capacitance C is observed. At a point 760 on curve 720, corresponding to a 0.1 volt noise spike, the value of capacitance C increases over that at point 750.

In one embodiment of the present invention, the shifting of the location of the flat band by about 0.48 volts may be accomplished by the use of the PMOS transistor 500 of FIG. 5. In order to move the flat band magnitude from about 1.5 volts to about 1.98 volts, a change of about 0.48 volts, one embodiment changes the threshold voltage Vt by changing the work function of the material comprising the gate region 510. The p+ poly-silicon gate region 110, which has a work function of approximately −0.56 volts, is replaced by a p+ platinum-silicide gate region 510, which has a work function of approximately −1.04 volts.

In alternate embodiments, other gate materials such as tantalum nitrate (TaN), iridium (Ir), nickel (Ni), or arsenic (As) may be used to obtain different flat band voltages, depending upon the magnitude of the voltage to be decoupled. These materials may be used by themselves or as dopants in silicon, poly-silicon, or other materials. In further embodiments, the flat band magnitude may be changed by changing the dopant levels of substrate 502 and channel area 508. Finally, in alternate embodiments when Vcc differs from 0.4 volts, a corresponding shift in flat band magnitude may be obtained by replacing the gate region 510 material or by changing the dopant levels in the substrate 502 and channel area 508.

Figure 8:
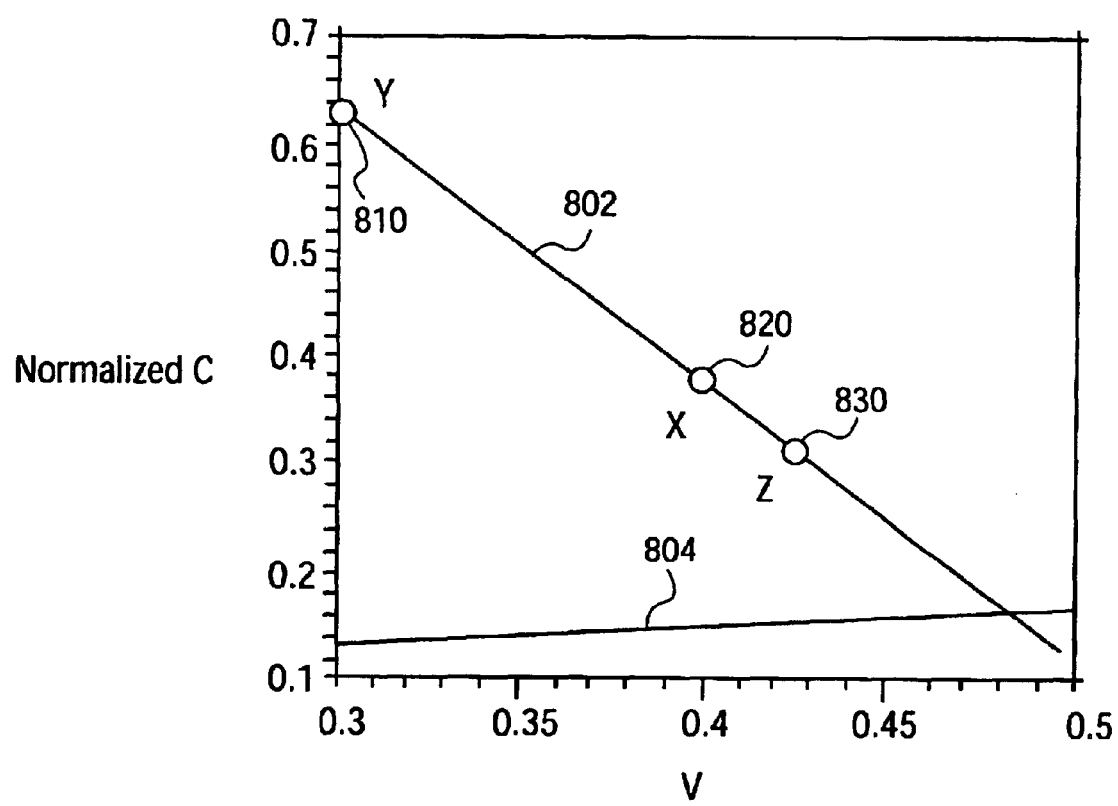
FIG. 8 is an enlargement of a portion of the chart of FIG. 7, according to one embodiment of the present invention.

Referring now to FIG. 8, an enlargement of a portion 740 of the chart of FIG. 7 is shown, according to one embodiment of the present invention. Curve 802 is a segment of curve 720 of FIG. 7, and curve 804 is a segment of curve 710 of FIG. 7. At point X 820 on curve 802, the value of V is that of the nominal Vcc, 0.4 volts. The initial capacitance of the weak inversion capacitor 600, at point X 820, is about 40% of that of a similar strong inversion capacitor 200. Therefore the area of weak inversion capacitor 600 would be increased by a factor of about 2.5 for equal capacitance of a strong inversion capacitor 200. The weak inversion capacitor 600 has a reduction in leakage of about 5 to 10 times compared with the strong inversion capacitor 200, and, moreover, the leakage increases with inversion density in channel area 508. In practice this means that the leakage and the capacitance increases under conditions of noise (point Y 810), where the additional leakage is acceptable in exchange for the increased capacitance. The leakage is minimized at the steady state value of Vcc at point X 820.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. An apparatus, comprising:

a metal-oxide-semiconductor transistor;

a metallic gate electrode coupled to a diffused gate region of said metal-oxide-semiconductor transistor and to a positive power supply voltage trace; and a metallic source electrode and a metallic drain electrode coupled to said metal-oxide-semiconductor transistor and to each other and to a negative power supply voltage trace, wherein said metal-oxide-semiconductor transistor includes the diffused gate region formed from material with a work function less than −0.56 volts.

2. The apparatus of claim 1, wherein said material of said diffused gate region is platinum silicate.

3. The apparatus of claim 1, wherein said material of said diffused gate region is selected from the group consisting of tantalum nitrate, iridium, nickel, and arsenic.

4. The apparatus of claim 1, wherein said metal-oxide-semiconductor transistor includes a heavily-doped substrate area.

5. The apparatus of claim 1, wherein said metal-oxide-transistor is a p-channel device.

6. The apparatus of claim 1, wherein said metal-oxide-transistor is an n-channel device.

7. An apparatus, comprising:

a metallic gate electrode coupled to a positive power supply voltage trace;

a diffused gate region formed from a material whose work function is less than minus 0.56 volts coupled to said metallic gate electrode;

a gate insulator coupled to said diffused gate region;

a channel coupled to said gate insulator;

a diffused drain coupled to said channel; and a diffused source coupled to said channel.

8. The apparatus of claim 7, wherein said material is platinum silicate.

9. The apparatus of claim 7, wherein said material is selected from the group consisting of tantalum nitrate, iridium, nickel, and arsenic.

10. The apparatus of claim 7, further comprising a substrate which is heavily-doped.

* * * * *

UNITED STATES PATENT AND TRADEMARK OFFICE
CERTIFICATE OF CORRECTION

PATENT NO. : 6,849,909 B1  
DATED : February 1, 2005  
INVENTOR(S) : Nair et al.

It is certified that error appears in the above-identified patent and that said Letters Patent is hereby corrected as shown below:

<u>Column 1,</u>
Line 16, delete "mar," and insert -- may --.

<u>Column 5,</u>
Line 42, after "times", insert -- when --.

Signed and Sealed this

Twenty-fourth Day of May, 2005

JON W. DUDAS
*Director of the United States Patent and Trademark Office*